United States Patent [19]

Inoue et al.

[11] Patent Number: 5,712,530
[45] Date of Patent: Jan. 27, 1998

[54] MERCURY LAMP OF THE SHORT ARC TYPE HAVING AN ELECTRODE TERMINAL WITH TANTALUM THEREON

[75] Inventors: Osamu Inoue; Toshiyuki Shima, both of Himeji, Japan

[73] Assignee: Ushiodenki Kabushiki Kaisha, Tokyo, Japan

[21] Appl. No.: 564,004

[22] Filed: Nov. 29, 1995

[30] Foreign Application Priority Data

Nov. 29, 1994 [JP] Japan .................. 6-317745

[51] Int. Cl.⁶ .................................................. H01J 61/04
[52] U.S. Cl. .................. 313/620; 313/631; 313/621
[58] Field of Search ...................... 313/620, 631, 313/632, 637, 558, 559, 570, 621, 571

[56] References Cited

U.S. PATENT DOCUMENTS

| | | | |
|---|---|---|---|
| 2,714,687 | 8/1955 | Isaacs et al. | 313/620 |
| 3,517,248 | 6/1970 | Eckel | 313/620 |
| 3,621,322 | 11/1971 | Rehmet | 313/571 |
| 4,937,496 | 6/1990 | Neiger et al. | 313/620 |
| 4,988,918 | 1/1991 | Mori et al. | 313/620 |
| 5,422,539 | 6/1995 | Chodora | 313/631 |
| 5,481,159 | 1/1996 | Hiramoto et al. | 313/570 |

FOREIGN PATENT DOCUMENTS 41 19 031  12/1992  Germany.

Primary Examiner—Sandra L. O'Shea
Assistant Examiner—Jay M. Patidar
Attorney, Agent, or Firm—Sixbey Friedman Leedom & Ferguson; David S. Safran

[57] ABSTRACT

A mercury lamp of the short arc type in which tantalum can absorb impurity gases to a sufficient degree even if the inside of the arc tube reaches a high temperature is achieved by providing an arc tube, within which mercury and an inert gas are encapsulated, with a pair of electrodes disposed opposite each other within the arc tube, each of the electrodes being supported by a respective terminal post, tantalum being provided on the terminal post of one of the electrodes, and by ensuring that both of the relationships (D2/D1)>1.3 and the relationship $0.2 \leq (D2/D1)^2/L \leq 0.5$ are satisfied at the same time, where D1 is an outer diameter of the terminal post in millimeters, D2 is an outer diameter of the electrode supported by the respective terminal post in millimeters, and L is a distance between a tip of the electrode on which the tantalum is provided and the tantalum on the terminal post of that electrode.

5 Claims, 4 Drawing Sheets

MERCURY LAMP OF THE SHORT ARC TYPE HAVING AN ELECTRODE TERMINAL WITH TANTALUM THEREON

BACKGROUND OF THE INVENTION

1. Field of the Invention

The invention relates to a mercury lamp of the short arc type. The invention relates especially to a mercury lamp of the short arc type which is used as a light source of a semiconductor exposure device or a liquid crystal display manufacturing device.

2. Description of the Related Art

In a mercury lamp of the short arc type, generally, two electrodes are arranged opposite one another in the arc tube with a small distance therebetween. A lamp of this type is used in combination with an optical system as a light source for an exposure device since its emission is very similar to that of a point light source.

However, during luminous operation the electrodes have a high temperature. Therefore, if impurity gases such as oxygen, carbon dioxide gas and the like are mixed in the arc tube, in the tip parts of the electrodes which reach the highest temperature, oxide and carbide materials are produced which are vaporized within the arc tube. The vaporized materials adhere to the inside of the arc tube; this causes blackening, and thus, in the exposure device or the like, a reduction in the illumination intensity on the irradiated surface. Furthermore, due to vaporization and deformation of the tip parts of the electrodes, variation of arc bright spots occurs.

Therefore, to absorb the impurity gases within the arc tube, a getter is provided on a terminal post which supports the electrode. There are certain metals which are used for this getter. Typical metals which are currently used for a mercury lamp of the short arc type are zirconium and tantalum. In particular, tantalum has a relatively high operating temperature from 700° to 1200° C. at which it acts as a getter. Furthermore, it has a low vapor pressure and was, therefore, optimum for a lamp of this type in which the temperature within the arc tube becomes high.

However, recently, the demand for a reduction in the size of the mercury lamp has become more and more frequent according to the reduction in size of the exposure device. To meet this demand, the temperature within the arc tube cannot be prevented from becoming high. Consequently, the temperature range in which the tantalum acts as a getter, i.e., 700° to 1200° C., could not be provided within the arc tube.

SUMMARY OF THE INVENTION

Therefore, a primary object of the present invention is to devise a good mercury lamp of the short arc type in which tantalum can absorb impurity gases to a sufficient degree, even if the inside of the arc tube reaches a very high temperature.

The object is achieved, according to the invention, by the fact that, in a mercury lamp of the short arc type in which each of two electrodes are supported by a respective terminal post and are located opposite one another within the arc tube. Moreover, tantalum is provided on the terminal post, with the following relationships being satisfied at the same time:

$$(D2/D1) \geq 1.3 \quad (1)$$

$$0.2 \leq (D2/D1)^2/L \leq 0.5 \quad (2)$$

where D1 is the outside diameter of the terminal post in millimeters (mm), D2 is the outside diameter of the electrode supported by the terminal post in millimeters (mm) and L is the distance between the tip of the electrode and the tantalum in millimeters (mm).

The noted object is achieved, furthermore, according to the invention, by the tantalum being line-shaped or layer-like, and by its being attached to the terminal post by welding or sweating or sealing.

The object is achieved, moreover, according to the invention, by the respective terminal post being made integrally with the respective electrode supported by it.

The inventors have ascertained that tantalum under certain conditions still has the getter action, even if its temperature is greater than or equal to the upper limit of the temperatures at which it acts as a getter (specifically temperatures greater than or equal to 1300° C.).

This was confirmed. That is, due to the fact that the lamp itself has been made smaller to an unprecedented level and the temperature within the arc tube has been increased, the temperature range of the tantalum, which until then had never been questioned, was checked again by the present inventors.

As a result, the present inventors found that, in the case of a tantalum temperature of at least 1300° C., the attachment site on the terminal post and the ratio between the electrode and the terminal post play an important role, and that the getter action cannot be achieved without specially fixing the attachment site of the tantalum on the terminal post as in a conventional lamp.

This means that they found that the tantalum, in a new application form which had been devised for the first time, can absorb impurity gases even if its temperature is greater than or equal to 1300° C. (specifically in the temperature range from 1300° to 1700° C.), 1300° C. having conventionally been regarded as the uppermost temperature at which the getter action can be achieved.

The concept of the new application form, here, first of all, means fixing the ratio between the outside diameter of the electrode and the outside diameter of the terminal post. In this case, it is a matter of preventing the heat generated in the electrodes from beings easily transferred to the terminal posts and of suppressing a more sudden rise of the temperature of the terminals posts. Specifically, it is necessary that the ratio of the outside diameter of the electrode to the outside diameter of the terminal post is greater than or equal to 1.3.

Furthermore, in addition to this condition, the attachment site of the tantalum to the terminal post is fixed. Specifically, satisfying the relationship $0.2 \leq (D2/D1)^2/L \leq 0.5$, where L is the distance between the electrode tip and an end of the tantalum on the arc side, D1 is the outside diameter of the terminal post, and D2 is the outside diameter of the electrode.

By attaching the tantalum to the terminal post while satisfying these two conditions its temperature can be stabilized within the range from 1300° to 1700° C.

In one embodiment, the production of the lamp, i.e., installation of the electrodes, is easily performed and handling is simplified, since the tantalum is line-shaped or layer-like. By this form of the tantalum, furthermore, upon attachment to the terminal post, the post can be wound with tantalum and relatively easy attachment can be accomplished. In addition, the tantalum is securely attached to the terminal post, no position deviation occurring in doing so, since attachment is produced by welding or sweating or sealing.

In a further arrangement, the disadvantage of the impurity gases remaining is eliminated by the measure by which the terminal post is made integrally with the respective electrode which is supported by it. That is, because, in contrast to plugging the terminal post into the electrode, there is no longer a cavity between the electrode and the terminal post.

These and further objects, features and advantages of the present invention will become apparent from the following description when taken in connection with the accompanying drawings which, for purposes of illustration only, show several embodiments in accordance with the present invention.

DETAILED DESCRIPTION OF THE PREFERRED EMBODIMENTS

Figure 1:
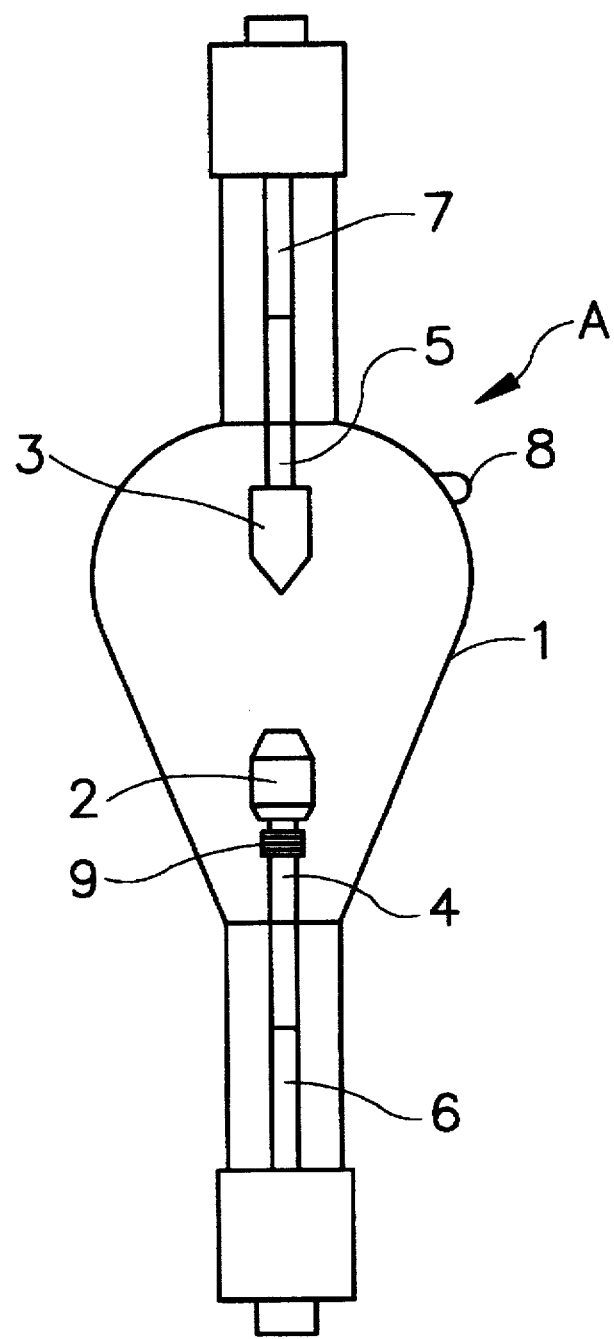
FIG. 1 is a schematic depiction of a mercury lamp of the short arc type according to the invention.

FIG. 1 schematically depicts a mercury lamp A of the short arc type according to the invention which is used as a light source device, such as for a semiconductor exposure device or the like.

In the drawing, the lamp A has an roughly oval bulb 1. Within bulb 1 is an anode 2 and cathode 3, each of which is supported by a respective terminal post 4, 5. These terminal posts 4, 5 are each connected to a respective metal foil 6, 7. Bulb 1, furthermore, has an outlet tube residue 8.

Figure 6:
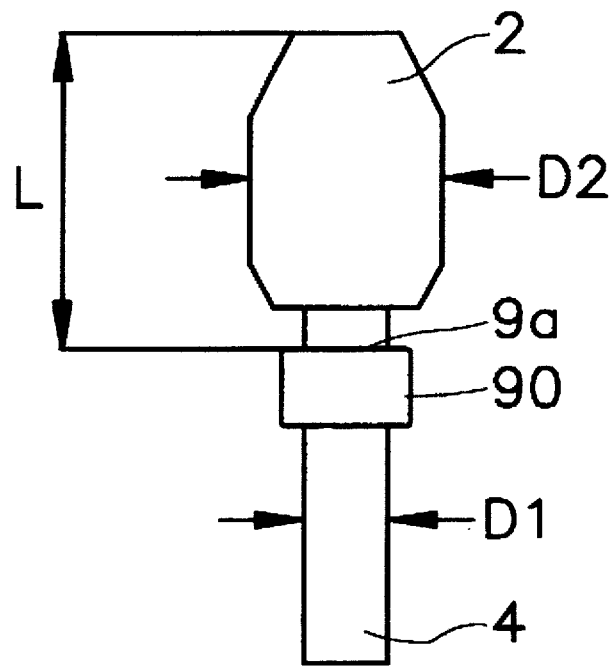
FIG. 6 schematically shown another embodiment of the electrode of the mercury lamp according to the invention, wherein the tantalum is layer-like attached on the terminal past.

The anode side terminal post 4 is wound with tantalum wire 9. After terminal post 4 has been wound with this tantalum wire 9, tantalum wire 9 is secured by local welding. The tantalum need be not only wire-shaped, and instead, the terminal post 4 can be wound with a sheet-shaped layer of tantalum 90 as shown in FIG. 6.

In this lamp A, so-called flash luminous operation is accomplished, in which, for example, operation with a power consumption of 700 W is repeatedly alternated with operation with a power consumption of 1000 W. In the idling state, with the 700 W power consumption, the luminous voltage is 44 V and the luminous current is 16 A, while in the flash state with a 1000 W power consumption, the luminous voltage is 45 V and the luminous current is 25 A.

The distance between the electrodes of lamp A is for, example, 2.9 mm and the inner volume of the bulb is, for example, 13.4 cc. Within the bulb, for example, 45.5 mg/cc of mercury and 200 torr of argon as the inert gas are encapsulated.

In the following, the electrode, the terminal post and the tantalum which is installed on the terminal post are described.

Figure 2:
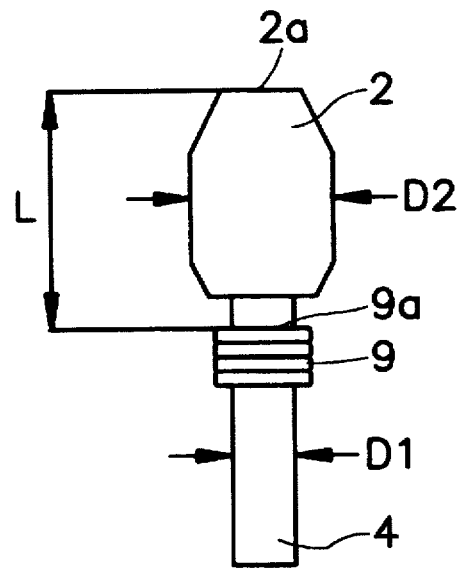
FIG. 2 schematically shows an electrode of the mercury lamp of the short arc type according to the invention with tantalum installed on the terminal post.

FIG. 2 schematically shows an anode of lamp A in FIG. 1, the terminal post 4 which supports it, and of the tantalum wire 9 which is attached to the terminal post 4. Anode 2 has outer diameter D2 of 8 mm and the flat end of the anode tip 2a has a diameter of 3 mm, an angle of roughly 85° of a truncated cone shape that bridges between the outer diameter D2 and the tip 2a. The length of the anode 2 in its longitudinal direction is 15 mm. This anode 2 is made of tungsten.

Terminal post 4 has outer diameter D1 of 4 mm, is made of tungsten and as an integral part with anode 2. That is, the terminal post 4 is formed of a one-piece construction with anode 2. The tantalum wire 9 is secured to terminal post 4, as was described above, at a position which is a distance L from the tip 2a of the anode 2, the distance L being measured from the arc side end 9a of the tantalum 9 (the end at the start of the winding) and is 15 mm.

That is, construction was performed so as to satisfy the following relationships between D1, D2 and L:

$$(D2/D1) \geq 1.3 \quad (1)$$

and at the same time $$0.2 \leq (D2/D1)^2/L \leq 0.5 \quad (2)$$

(Test 1)

A test was run in which the ratio between the temperature of the tantalum wire and its getter effect was studied.

Figure 3:
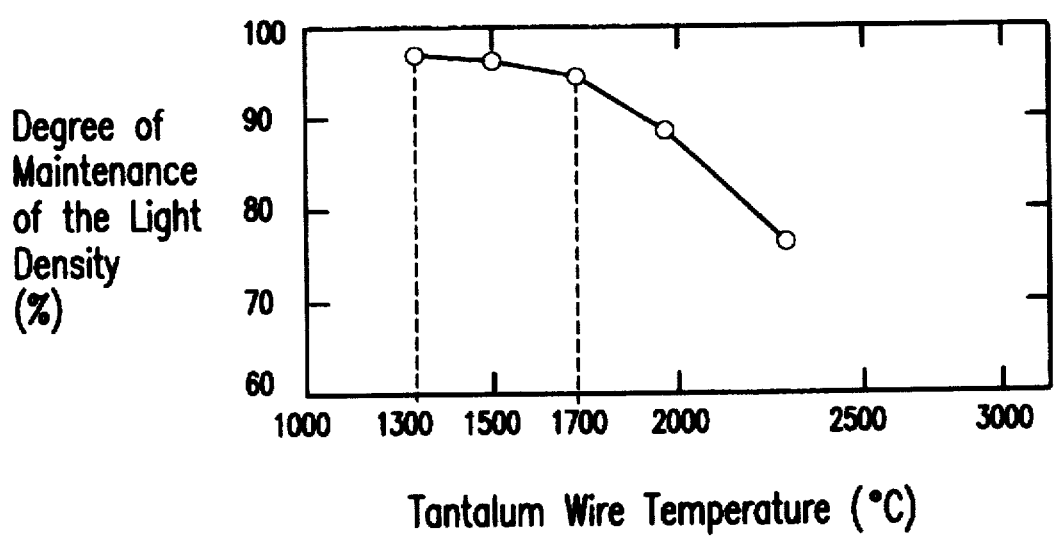
FIG. 3 graphically depicts the relationship between the tantalum temperature and its getter effect.

FIG. 3 shows experimental data of the degree of maintenance of the light density (i.e., the percentage of the original light density remaining) after 1000 hours of luminous operation, the attachment site and the temperature of the tantalum wire having been changed. In this test, the same lamp as lamp A in FIG. 1 was used. The temperature of the tantalum wire was established by changing the distance between the anode tip and the end of the tantalum wire on the arc side and by designating the temperature of the arc side end (9a) as the temperature of the tantalum wire.

It is clear from FIG. 3 that, within a temperature range of the tantalum wire from 1300° to 1700° C., even after 1000 hours of luminous operation at least 95% degree of maintenance of the light density was obtained, and the impurity gases within the bulb were advantageously captured. If, however, the temperature of the tantalum wire is greater than 1700° C., the degree of maintenance of the light density decreases acutely. This shows that by fixing the temperature of the tantalum wire in the range from 1300° to 1700° C., the getter effect is advantageously obtained.

(Test 2)

Figures 4, 5:
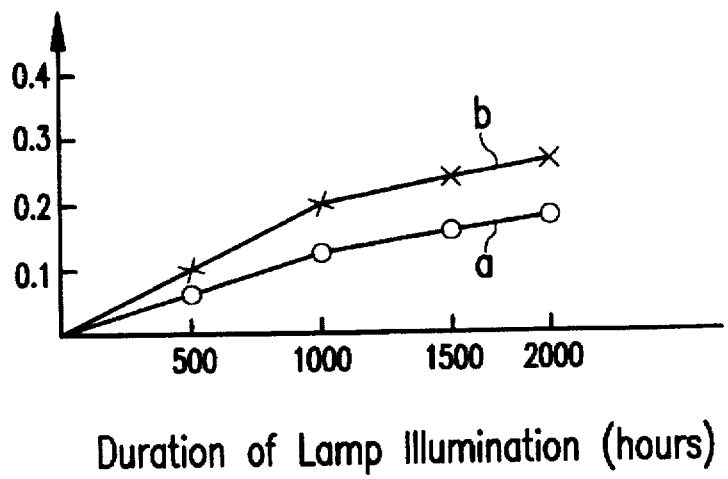
FIG. 4 is a graphic depiction of plots showing relationship between the temperature of the tantalum and vaporization of the electrode material.
FIG. 5 shows a graphic plots which illustrate the relationship between the tantalum temperature and the light density.

A test was run in which the relationship between the temperature of the tantalum wire and the vaporization of the electrode material was studied. FIG. 4 shows the results. In this test, the vaporization of the electrode material was measured by resultant widening of the distance between the electrodes. For this test, two lamps were used in which the temperature of the tantalum wire was 1500° C. for one and the temperature of the tantalum wire was 2000° C. for the other.

The results of this test show that, in a lamp with a temperature of the tantalum wire of 1500° C. (curve a), even after 2000 hours of luminous operation, the widening of the distance between the electrodes is less than or equal to 0.2 mm, and that vaporization of the electrode material is suppressed.

On the other hand, in a lamp with a temperature of the tantalum wire of 2000° C. (curve b), it is apparent that, after 2000 hours of luminous operation, the widening of the distance between the electrodes is greater than or equal to 0.3 mm, and the electrode material having been vigorously vaporized.

This means that it also becomes apparent from this test that the tantalum captures the impurity gases within the bulb in an advantageous manner and suppresses vaporization of the electrode material when the temperature of the tantalum wire is 1500° C.

(Test 3)

A test was run in which the relationship between the temperature of the tantalum wire and the degree of maintenance (%) of the light density was studied over the course of time. FIG. 5 shows the results.

For this test, the same two lamps were used as in test 2, in which the temperature of the tantalum wire was 1500° C. for one of the lamps and the temperature of the tantalum wire for the other was 2000° C.

The test results show that, in a lamp with a temperature of the tantalum wire of 1500° C. (curve a1), even after 2000 hours of luminous operation, at least 90% of the degree of maintenance of the light density is still obtained (where the light density at the start of luminous operation is designated 100%), and thus, good light density is maintained.

On the other hand, in a lamp with a temperature of the tantalum wire of 2000° C. (curve b1), it is apparent that, after 2000 hours of luminous operation, the degree of maintenance of the light density is less than or equal to 90%, indicating that the end of the service life has been reached prematurely.

This means that it also becomes apparent from the a1 test that the impurity gases within the bulb are captured by this tantalum wire, and thus, vaporization of the electrode material is suppressed, since the temperature of the tantalum wire is 1500° C., and thus, in the range from 1300° to 1700° C. If this mercury lamp of the short arc type is installed in an exposure device, therefore, the degree of maintenance of the illumination intensity of the exposure light increases.

As is described above, in the mercury lamp of the short arc type according to the invention, by fixing the ratio between the outside diameter of the electrode and the outside diameter of the terminal post, and by fixing the point at which the inner terminal is wound with tantalum, the temperature of the tantalum can be maintained within the range from 1300° to 1700° C. and a good getter effect can be obtained.

Furthermore, the action of the invention can be obtained regardless of whether it is the anode or the cathode that is wound with the tantalum under the above described conditions.

The invention can be broadly used for a mercury lamp with a power consumption from 500 W to 5 kW. However, it is advantageously usable, especially among others, for a lamp with a power consumption of 1 KW to 2 kW.

In addition, the invention is not restricted only to mercury lamps of the short arc type described using the FIG. 1 embodiment having a roughly oval arc tube, but can be used for a conventional, mercury lamp of the short arc type having a roughly spherical arc tube or an arc tube in the shape of a rugby ball.

It is to be understood that, although a preferred embodiment of the invention has been described, various other embodiments and variations may occur to those skilled in the art. Any such other embodiments and variations which fall within the scope and spirit of the present invention are intended to be covered by the following claims.

What we claim is:

1. Mercury lamp of the short arc type, comprising an arc tube with a pair of electrodes disposed opposite each other within the arc tube, each of the electrodes being supported by a respective terminal post, tantalum being provided on the terminal post of at least one of the electrodes; and wherein both the following relationships:

$$(D2/D1) \geq 1.3 \text{ and } 0.2 \leq (D2/D1)^2/L \leq 0.5$$

are satisfied at the same time for each electrode which has tantalum on the respective terminal post thereof, where $D1$ is an outer diameter of the respective terminal post in millimeters, $D2$ is an outer diameter of the electrode supported by the respective terminal post thereof in millimeters, and $L$ is a distance between a tip of the electrode and the tantalum provided on the respective terminal post thereof.

2. Mercury lamp of the short arc type according to claim 1, wherein the said tantalum is attached to the terminal post of the respective electrode by one of welding, sweating and sealing.

3. Mercury lamp of the short arc type according to claim 2, wherein the tantalum is wire-shaped.

4. Mercury lamp of the short arc type according to claim 2, wherein the tantalum is in the form of a sheet-shaped layer.

5. Mercury lamp of the short arc type according to claim 1, wherein each terminal post is an integral part of the respective electrode which supported by it.

* * * * *